United States Patent [19]
Silvey et al.

[11] Patent Number: 5,394,444
[45] Date of Patent: Feb. 28, 1995

[54] LOCK DETECT CIRCUIT FOR DETECTING A LOCK CONDITION IN A PHASE LOCKED LOOP AND METHOD THEREFOR

[75] Inventors: John M. Silvey; J. Christopher Smallwood, both of Austin, Tex.

[73] Assignee: Motorola, Inc., Schaumburg, Ill.

[21] Appl. No.: 88,951

[22] Filed: Jul. 12, 1993

[51] Int. Cl.⁶ .................... H04L 7/00; H03D 3/24
[52] U.S. Cl. .................. 375/374; 375/376; 327/156
[58] Field of Search ............ 375/118, 119, 120; 328/155, 63, 134; 307/510, 511

[56] References Cited

U.S. PATENT DOCUMENTS

| | | | |
|---|---|---|---|
| 3,863,156 | 1/1975 | Bogert | 325/346 |
| 4,639,680 | 1/1987 | Nelson | 328/134 |
| 4,853,841 | 8/1989 | Richter | 364/200 |
| 4,876,518 | 10/1989 | Perkins | 331/1 A |
| 4,929,916 | 5/1990 | Fukuda | 331/1 A |
| 4,988,955 | 1/1991 | Horie | 331/11 |
| 5,008,635 | 4/1991 | Hanke et al. | 331/1 A |
| 5,126,690 | 6/1992 | Bui et al. | 331/1 A |
| 5,168,245 | 12/1992 | Koskowich | 331/1 A |
| 5,173,927 | 12/1992 | Strommer | 375/81 |
| 5,260,979 | 11/1993 | Parker et al. | 375/120 |
| 5,278,702 | 1/1994 | Wilson et al. | 375/120 |

Primary Examiner—Stephen Chin
Assistant Examiner—Tesfaldet Bocure
Attorney, Agent, or Firm—Elizabeth A. Apperley

[57] ABSTRACT

A lock detect circuit (18) determines when a reference frequency and a feedback frequency are frequency locked using a reference counter (32) and a feedback counter (36). The reference counter (32) and the feedback counter (36) are clocked by the reference frequency and the feedback frequency, respectively. After a first period of time, the outputs of the counters are compared. The outputs of the counters are also compared at the end of a second period of time. To be frequency locked, the two count values must be equal at both the end of the first and the second periods of time. A count window is generated from the reference frequency signal to indicate a range of frequencies for which the feedback frequency is locked. Once lock is achieved, the count window is widened such that the feedback frequency is still within a lock range when some aliasing occurs.

19 Claims, 7 Drawing Sheets

LOCK DETECT CIRCUIT FOR DETECTING A LOCK CONDITION IN A PHASE LOCKED LOOP AND METHOD THEREFOR

FIELD OF THE INVENTION

This invention relates generally to a phase locked loop, and more particularly to a lock detect circuit for detecting a lock condition in a phased lock loop.

BACKGROUND OF THE INVENTION

Phase locked loop circuits are well known in the data processing art as clock generators which provide stable clock signals having predetermined, stable frequencies. The stability of each frequency is provided as a result of an iterative process which uses a feedback path to compare an output of the phase lock loop circuit with an input signal typically provided by a crystal oscillator.

During execution of this iterative process, a lock detect circuit generally indicates that a lock condition has been satisfied when the feedback provided by the phase lock loop circuit is at a level which is within a certain percentage of a crystal oscillator frequency. When lock is first detected, the feedback frequency may surpass, or overshoot, the crystal oscillator frequency. The feedback frequency is then decreased until it is lower than the crystal oscillator frequency. In such a case, the feedback frequency continues to oscillate around the crystal oscillator frequency of the crystal oscillator until it is within the certain percentage of the frequency of the crystal oscillator. At that point in time, the phase lock loop is said to have achieved lock. However, during the period of time in which the feedback frequency is overshooting and undershooting the frequency of the crystal oscillator, the lock detect circuit may erroneously indicate that lock is achieved.

Many variations of the phase lock loop circuit have been developed to provide improvements over this technology. For example, U.S. Pat. No. 4,929,916, describes a phase lock detection circuit which does not generate an erroneous lock signal during the transient process of the output of the phase lock loop circuit towards the crystal oscillator. The phase lock detection circuit disclosed in U.S. Pat. No. 4,929,916 generates a phase lock signal only when the output of the phase lock loop circuit satisfies the lock condition for a predetermined period of time. If the lock condition has been satisfied for the predetermined period of time, it may be concluded that a stable locked condition has been realized.

While the invention described in U.S. Pat. No. 4,929,916 provides a unique solution to determining a stable lock condition, the implementation of the invention requires the use of analog signals to perform a phase lock operation. Such use of analog signals is well known in the data processing art. However, because analog signals are used during phase match detection, small amounts of noise inherent in the circuitry used to implement the phase lock loop circuit may result in the lock condition of the circuit being either erroneously set or cleared. Such susceptibility to noise may result in the phase lock loop circuit providing incorrect and unreliable results. Additionally, because analog circuitry is typically required in phase lock loop circuitry, the accuracy of the analog circuitry is often sensitive to minimal variations in the processing parameters used to manufacture the phase lock loop circuit.

Phase lock loop circuits are generally susceptible to metastability which results in phase lock loop circuits that are not stable and may produce erroneous results. Additionally, the sensitivity to processing parameter variations exhibited by typical phase lock loop circuits may result in unreliable results and an inability of a designer to accurately predict an output of the phase lock loop circuit.

SUMMARY OF THE INVENTION

The previously mentioned needs are fulfilled with the present invention. Accordingly, there is provided, in a first form, a lock detect circuit. A lock detect circuit includes a first input circuit for receiving a reference frequency and a second input circuit for receiving a feedback frequency. A reference counter is connected to the first input circuit for receiving the reference frequency. The reference counter counts to a reference count value during a first period of time. The reference counter provides a freeze signal to indicate the reference counter has reached the reference count value. A feedback counter is connected to the second input circuit for receiving the feedback frequency. The feedback counter counts for the first period of time to generate a feedback count value. A comparison circuit compares the feedback count value to the reference count value. The comparison circuit asserts the match signal when the feedback count value is equal to the reference count value and a locked signal is negated. The comparison circuit also asserts the match signal when the feedback count value is one of a range of lock values and the locked signal is asserted. The comparison circuit is connected to the feedback counter for receiving the feedback count value. A match detector is connected to the comparison circuit for providing the locked signal. The match detector asserts the locked signal when the comparison circuit asserts the match signal for both a second period of time and a third period of time, the third period of time successively following the second period of time.

There is provided in a second form, a method for detecting lock in a phase lock loop circuit. The method includes the steps of receiving a reference frequency signal and receiving a feedback frequency signal. A reference counter is enabled to count for a first period of time using the reference frequency signal. The reference counter provides a first reference count value. A feedback counter is concurrently enabled to count for the first period of time using the feedback frequency signal. The feedback counter provides a first feedback count value. The method also includes the step of comparing the first reference count value and the first feedback count value to provide a first match signal. The first match signal is asserted when the first feedback count value is equal to the first reference count value and a locked signal is negated. During a next step, the first match signal is provided to a match detect circuit. The match detect circuit stores the first match signal therein. The reference counter is enabled to count for a second period of time using the reference frequency signal. The reference counter provides a second reference count value. The feedback counter is concurrently enabled to count for the second period of time using the feedback frequency signal. The feedback counter provides a second feedback count value. The second reference count value and the second feedback count value are compared to provide a second match signal. The second match signal is asserted when the second feedback count value is equal to the second reference count value and the locked signal is negated. The method also includes the step of providing the second match signal to the match detect circuit, the match detect circuit asserting the locked signal when both the first match signal and the second match signal are asserted.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

The present invention provides a lock detect circuit for determining when a lock condition is achieved in a phase lock loop circuit. The lock detect circuit provided herein uses frequency, rather than phase, to determine if the lock condition has been satisfied. Prior art systems have typically used phase matching to determine whether or not the lock condition has been achieved. By detecting when a frequency match condition occurs, rather than phase match information, a phase lock loop circuit is generated which is less susceptible to noise and less sensitive to variations in processing parameters.

The functionality of the lock detect circuit described herein provides improvement over traditional implementations of phase lock loop circuits because it uses only digital circuitry and does not require any analog circuitry. The circuitry is all digital and, therefore, is easier to control. Such controllability enables the phase lock loop circuit to be more easily customized to tolerate the noisy conditions of the digital environment in which it will be implemented. As well, the digital implementation of the phase lock loop circuit described herein is able to provide an output which reflects a relationship between a clock signal generated by a voltage controlled oscillator and an oscillator clock signal generated by an external frequency source. This relationship may be used even when the clock signal generated by the voltage controlled oscillator is not within a range defined to indicate that the lock condition has been satisfied. Such a feature may be used to control functions other than the voltage controlled oscillator which are auxiliary to the phase locked loop circuit. For example, a charge pump circuit used to control operation of the voltage controlled oscillator may use the above mentioned feature to provide quicker changes in the output of the voltage controlled oscillator without the risk of "overshooting" the frequency of the oscillator clock signal.

These and other features will subsequently be discussed in more detail. Additionally, during a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

Figure 1:
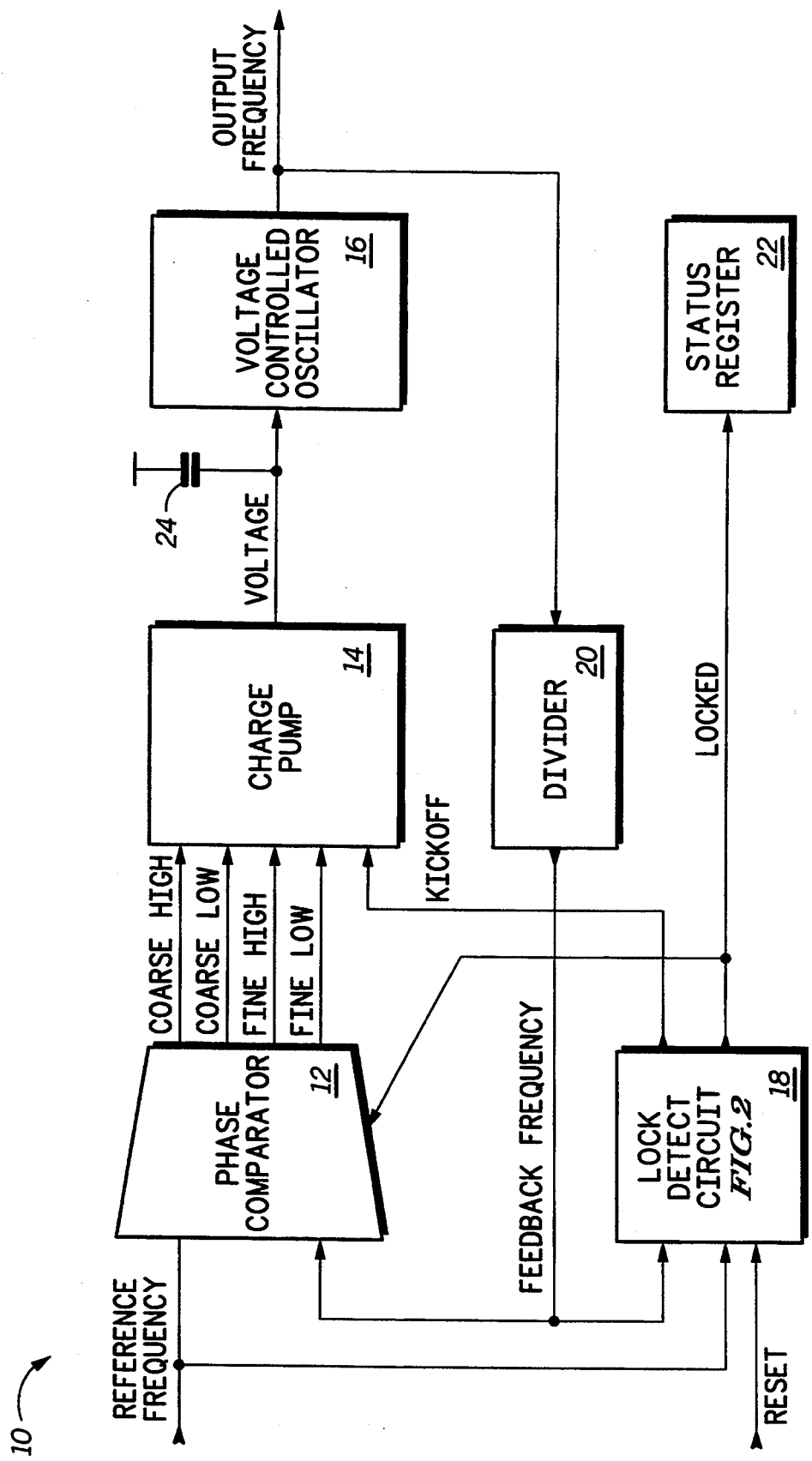
FIG. 1 illustrates in partial block diagram form a phase lock loop circuit in accordance with the present invention.

FIG. 1 illustrates one embodiment of the present invention. The present invention implements a phase lock loop circuit 10. Phase lock loop circuit 10 generally includes a phase comparator 12, a charge pump 14, a capacitor 24, a voltage controlled oscillator 16, a lock detect circuit 18, a divider 20, and a status register 22.

A Reference Frequency signal is provided to a first input of each of phase comparator 12 and lock detect circuit 18. A Reset signal is provided to a second input of lock detect circuit 18. A first output of lock detect circuit 18 is a signal labeled "Kickoff". The Kickoff signal is provided to a first input of charge pump 14. A second output of lock detect circuit 18 is a signal labeled "Locked". The Locked signal is provided to a second input of phase comparator 12 and an input of status register 22. Phase comparator 12 has a plurality of outputs. A first output of phase comparator 12 is labeled "Coarse High" and is provided to a second input of charge pump 14. A second output of phase comparator 12 is labeled "Coarse Low" and is provided to a third input of charge pump 14. A third output of phase comparator 12 is labeled "Fine High" and is provided to a fourth input of charge pump 14. A fourth output of phase comparator 12 is labeled "Fine Low" and is provided to a fifth input of charge pump 14. Charge pump 14 has an output for providing a Voltage signal. The output of charge pump 14 is connected to a first terminal of capacitor 24 and an input of voltage controlled oscillator 16. A second terminal of capacitor 24 is connected to a power source (not shown). An output of voltage controlled oscillator 16 is labeled "Output Frequency" and is provided to both an external integrated circuit pin (not shown) and an input of divider 20. An output of divider 20 is connected to a third input of phase comparator 12 and a third input of lock detect circuit 18 to provide a signal labeled "Feedback Frequency".

Figure 2:
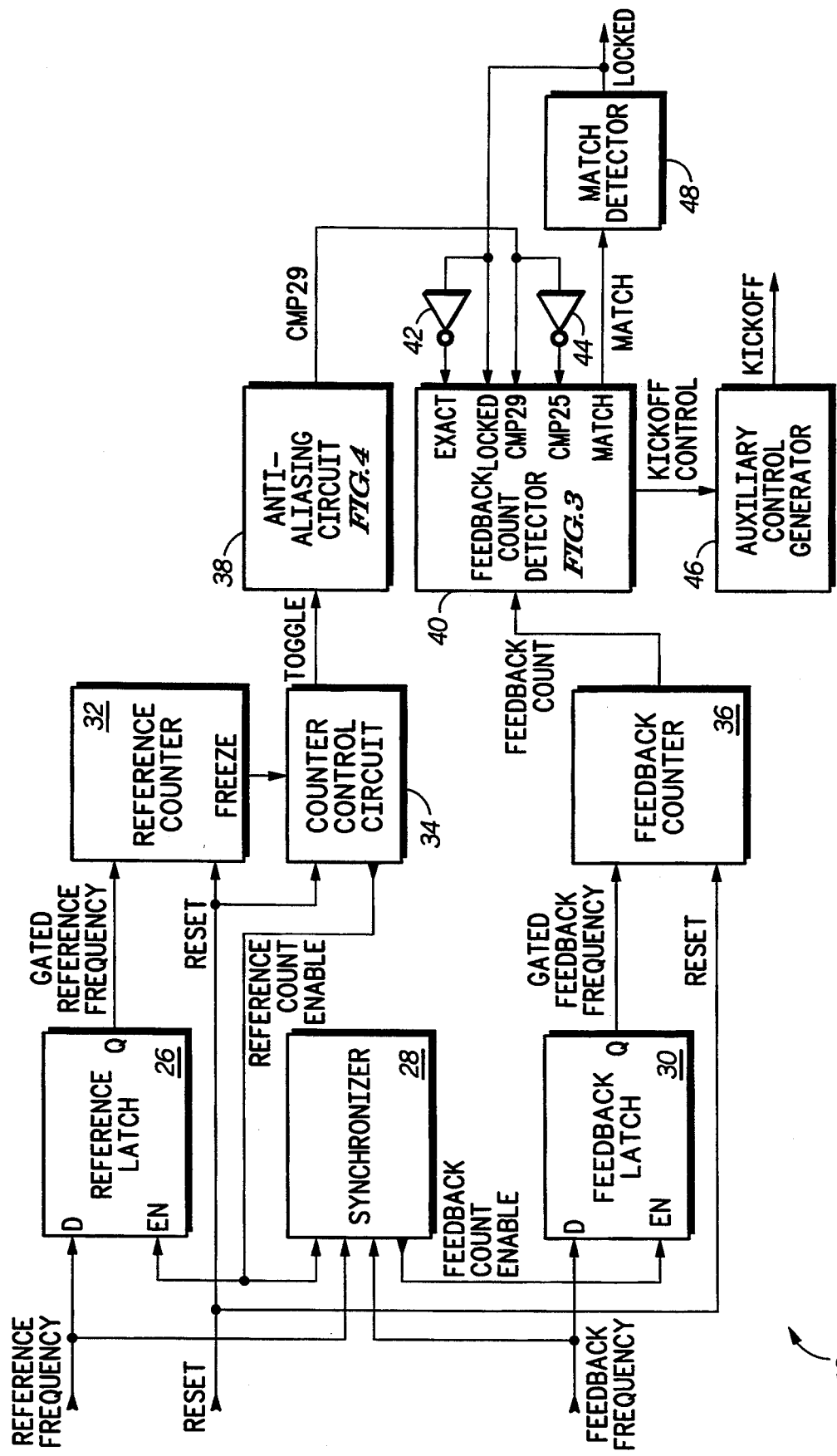
FIG. 2 illustrates in block diagram form a lock detect circuit of FIG. 1.

Lock detect circuit 18 is illustrated in more detail in FIG. 2. Lock detect circuit 18 generally includes a reference latch 26, a synchronizer 28, a feedback latch 30, a reference counter 32, a counter control circuit 34, a feedback counter 36, an anti-aliasing circuit 38, a feedback count detector 40, a first inverter 42, a second inverter 44, an auxiliary control generator 46, and a match detector 48.

The Reference Frequency signal is provided to reference latch 26 via a data (D) input. The Reference Frequency signal is also provided to a first input of synchronizer 28. An output (Q) of reference latch 26 is connected to a first input of reference counter 32 to provide a signal labeled "Gated Reference Frequency". The Reset signal is connected to a second input of each of reference counter 32, counter control circuit 34, and feedback counter 36. An output of reference counter 32 is connected to an input of counter control circuit 34 to provide a signal labeled "Freeze". A first output of counter control circuit 34 is connected to an enable (EN) input of reference latch 26 and a second input of synchronizer 28 to provide a signal labeled "Reference Count Enable". A second output of counter control circuit 34 is connected to anti-aliasing circuit 38 to provide a signal labeled "Toggle". An output of anti-aliasing circuit 38 is connected to a CMP29 input of feedback count detector 40 to provide a signal labeled "CMP29". The output of anti-aliasing circuit 38 is also connected to an input of inverter 44. An output of inverter 44 is connected to a CMP25 input of feedback count detector 40.

The Feedback Frequency signal is connected to a data (D) input of feedback latch 30. The Feedback Frequency signal is also connected to a third input of synchronizer 28. An output of synchronizer 28 is connected to an enable (EN) input of feedback latch 30 to provide a Feedback Count Enable signal. An output (Q) of feedback latch 30 is connected to a second input of feedback counter 36. Feedback counter 36 provides a signal labeled "Feedback Count" to an input of feedback count detector 40. A first output of feedback count detector 40 is connected to auxiliary control generator 46 to provide a signal labeled "Kickoff Control". A first output of auxiliary control generator 46 provides a signal labeled "Kickoff". A second output of feedback control detector 40 is connected to an input of match detector 48 to provide a signal labeled "Match". An output of match detector 48 is connected to both a Locked input of feedback count detector 40 and an input of inverter 42 to provide the Locked signal. An output of inverter 42 is connected to an Exact input of feedback count detector 40.

Figure 3:
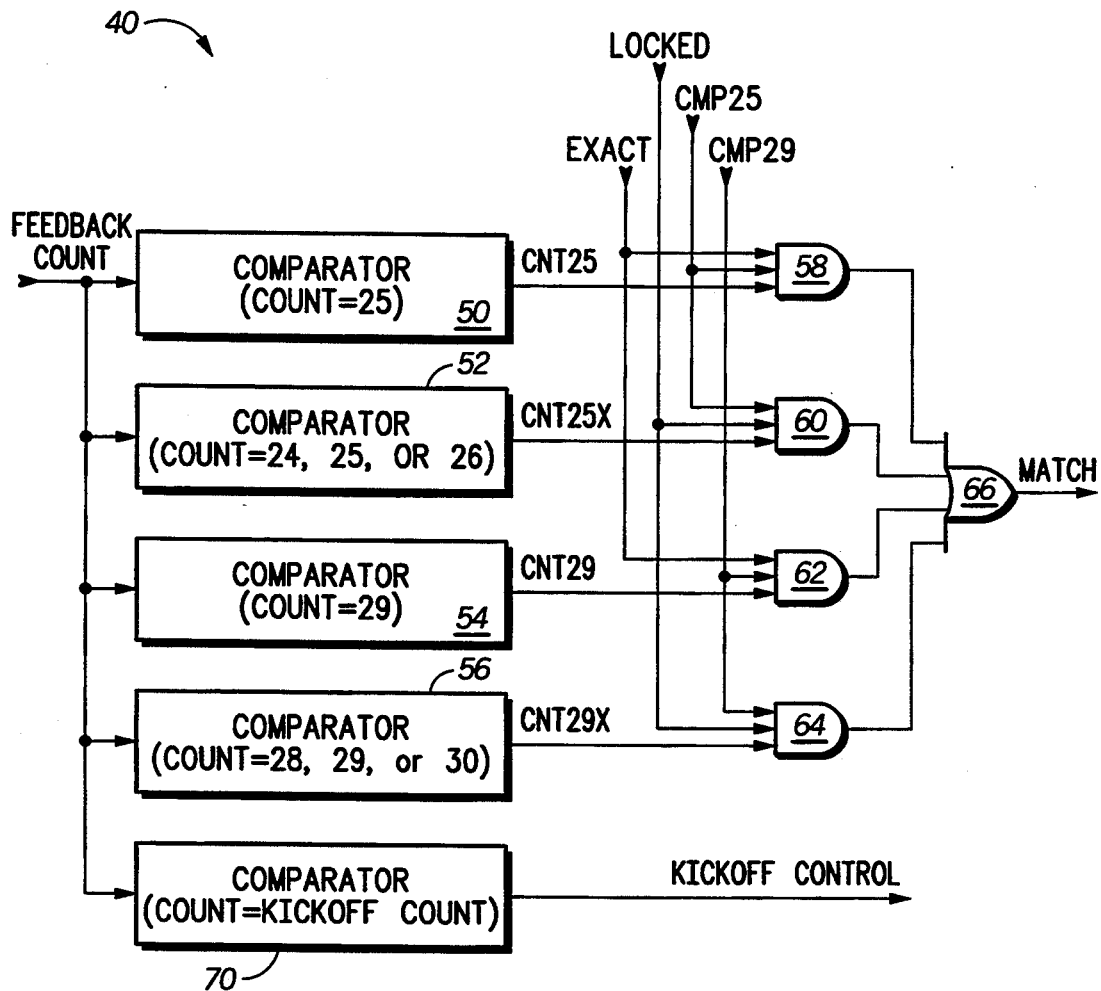
FIG. 3 illustrates in block diagram form a feedback count detector of FIG. 2.

Feedback count detector 40 is illustrated in more detail in FIG. 3. Feedback count detector 40 generally includes a comparator 50, a comparator 52, a comparator 54, a comparator 56, an AND gate 58, an AND gate 60, an AND gate 62, an AND gate 64, an OR gate 66, and a comparator 70.

The Feedback Count signal is provided to an input of each of comparator 50, comparator 52, comparator 54, comparator 56, and comparator 70. An output of comparator 50 is connected to a first input of AND gate 58 to provide a signal labeled "CNT25". An output of comparator 52 is connected to a first input of AND gate 60 to provide a signal labeled "CNT25X". An output of comparator 54 is connected to a first input of AND gate 62 to provide a signal labeled "CNT29". An output of comparator 56 is connected to a first input of AND gate 64 to provide a signal labeled "CNT29X". An output of comparator 70 provides the Kickoff Control signal.

The Exact signal is connected to a second input of each of AND gate 58 and AND gate 62. The Locked signal is provided to a second input of each of AND gate 60 and AND gate 64. The CMP25 signal is connected to a third input of each of AND gate 58 and AND gate 60. The CMP29 signal is connected to a third input of each of AND gate 62 and AND gate 64. An output of AND gate 58 is connected to a first input of OR gate 66 and an output of AND gate 60 is connected to a second input of OR gate 66. An output of AND gate 62 is connected to a third input of OR gate 66 and an output of AND gate 64 is connected to a fourth input of OR gate 66. An output of OR gate 66 provides the Match signal.

Figure 4:
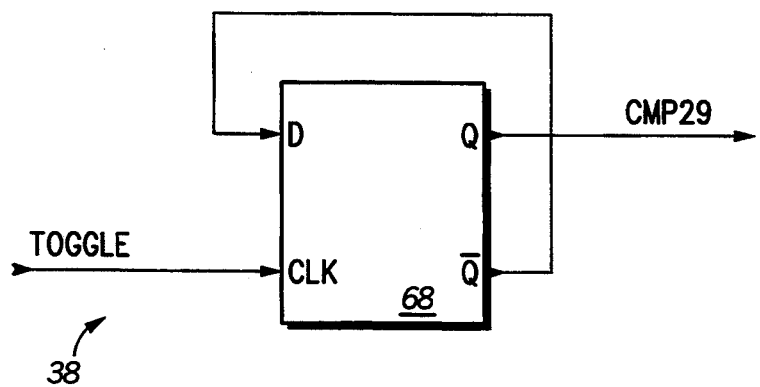
FIG. 4 illustrates in block diagram form an anti-aliasing circuit of FIG. 2.

FIG. 4 illustrates one embodiment of anti-aliasing circuit 38. In the embodiment shown herein, anti-aliasing circuit 38 is implemented as a flip-flop 68. The Toggle signal is provided to a clock (CLK) input of flip-flop 68. An output (Q) of flip-flop 68 is the CMP29 signal. An inverted output ($\overline{Q}$) of flip-flop 68 is connected to a data (D) input of flip-flop 68. The circuitry used to implement a flip-flop is well known in the data processing art and will not be discussed in more detail.

During operation of the phase lock loop circuit illustrated in FIG. 1, the Reference Frequency signal is provided to the phase comparator 12 by an external source such as a crystal oscillator. Phase comparator 12 asserts one of the plurality of signals, Coarse High, Coarse Low, Fine High, and Fine Low, to indicate a relationship of the Feedback Frequency signal to the Reference Frequency signal.

If a frequency of the Feedback Frequency signal is significantly lower than a frequency of the Reference Frequency signal, phase comparator 12 asserts the Coarse High signal to indicate that a coarse adjustment needs to be made to the Voltage signal. The Voltage signal is then provided to voltage controlled oscillator 16 such that the frequency of the Feedback Frequency signal is significantly increased. The Coarse Low signal is asserted to indicate that the frequency of the Feedback Frequency signal is significantly higher than the frequency of the Reference Frequency signal. When the Coarse Low signal is asserted, the Voltage signal is appropriately modified and provided to voltage controlled oscillator 16 such that the frequency of the Feedback Frequency signal is significantly decreased. Furthermore, when the frequency of the Feedback Frequency signal is within a certain range of frequencies, phase comparator 12 asserts one of the Fine High and Fine Low signals. The Fine High and Fine Low signals provide fine adjustment information to charge pump 14. Charge pump 14 reflects the fine adjustment information in the Voltage signal such that voltage controlled oscillator 16 adjust the frequency of the Feedback Frequency signal to either a slightly higher or a slightly lower frequency, respectively.

Lock detect circuit 18 provides a negated Kickoff signal to charge pump 14. The Kickoff signal is used to enable charge pump 14 to quickly provide a voltage signal when the phase lock loop circuit is first powered on. When voltage controlled oscillator 16 provides the output frequency in a predetermined range of frequencies, the Kickoff signal is asserted. A more detailed discussion of lock detect circuit 18 and the use of auxiliary circuits to control charge pump 14 will follow.

During operation, charge pump 14 outputs the Voltage signal at a voltage level determined by one of the Coarse High, Coarse Low, Fine High, Fine Low, and Kickoff signals. Voltage controlled oscillator 16 receives the Voltage signal and provides the Output Frequency signal at a frequency which is proportional to the voltage level of the Voltage signal. The Output Frequency signal is provided to divider 20 where a frequency division operation is performed. The Feedback Frequency signal is the output of divider 20. A value by which the divider divides the Output Frequency signal is programmable by a user of phase lock loop circuit 10. Frequency dividers are well known in the data processing art and, as such, will not be discussed in further detail herein.

The Feedback Frequency signal is subsequently provided to both phase comparator 12 to perform the operation described above and to lock detect circuit 18. During execution of lock detect circuit 18, the Feedback Frequency signal is tested to determine if phase lock loop circuit 10 has satisfied a frequency lock condition. When the frequency lock condition is achieved, a locked bit in status register 22 is asserted. A user of phase lock loop circuit 10 may then use that bit in status register 22 to determine if a stable clock is available for use in other data processing functions.

During operation, lock detect circuit 18 determines whether or not the Reference Frequency signal and the Feedback Frequency signal are frequency locked by using reference counter 32 and feedback counter 36. Reference counter 32 is clocked by the Reference Frequency signal and feedback counter 36 is clocked by the Feedback Frequency signal. At the end of a first predetermined period of time, an output of each of reference counter 32 and feedback counter 36 are compared. The outputs of each of reference counter 32 and feedback counter 36 are also compared at the end of a second predetermined period of time. To be frequency locked, the two count values must be equal at the end of both the first and the second periods of time. Additionally, by choosing the two periods of time such that they are not harmonically related to one another, a lock signal will not be erroneously detected even when the Feedback Frequency signal is aliasing.

Furthermore, the potential for metastable operation is greatly decreased by providing a count window which is generated from the Reference Frequency signal and is synchronized to the Feedback Frequency signal. The count window defines a range of frequencies for which the Feedback Frequency is considered to be locked to the Reference Frequency signal. In the embodiment of the invention described herein, the count window allows the Feedback Frequency signal to be within approximately 1.6% to 3.3% of the frequency of the Reference Frequency signal to still satisfy the locked condition. In this small range, the lock detect circuit may indicate that phase lock loop circuit 10 is toggling in and out of lock. Frequency hysteresis is used to stabilize this characteristic. Frequency hysteresis opens up the count window such that the Feedback Frequency signal may be within an approximate lock range of −3.3% to +3.3% of the frequency of the Reference Frequency signal and still satisfy the lock condition. When the Feedback Frequency signal drifts completely out of the lock range (±3.3%), lock detect circuit 18 will negate the Locked signal and phase lock loop circuit 10 will be considered to be "unlocked".

The percentages of the lock range are determined by a bit width of the counters used to implement reference counter 32 and feedback counter 36. In the embodiment of the invention described herein, reference counter 32 and feedback counter 36 are both five bits wide. As is well known in the data processing art, a precision of lock detect circuit 18 doubles for every counter stage which is added. For example, if reference counter 32 and feedback counter 36 had a bit width of six, the precision of lock detect circuit 18 would be in a range of ±1.65%. As additional stages are added to each of the counters, the precision of lock detect circuit 18 increases. However, more stages also require more time to detect when a lock condition has been satisfied. Therefore, a user of phase lock loop circuit 10 must balance the precision of lock detect circuit 18 with a time required to detect when the lock condition has been satisfied.

An overview of operation of phase lock loop circuit 10 has been provided hereto. Subsequently, operation of phase lock loop circuit 10 and lock detect circuit 18 will be described in more detail.

Figure 5A:
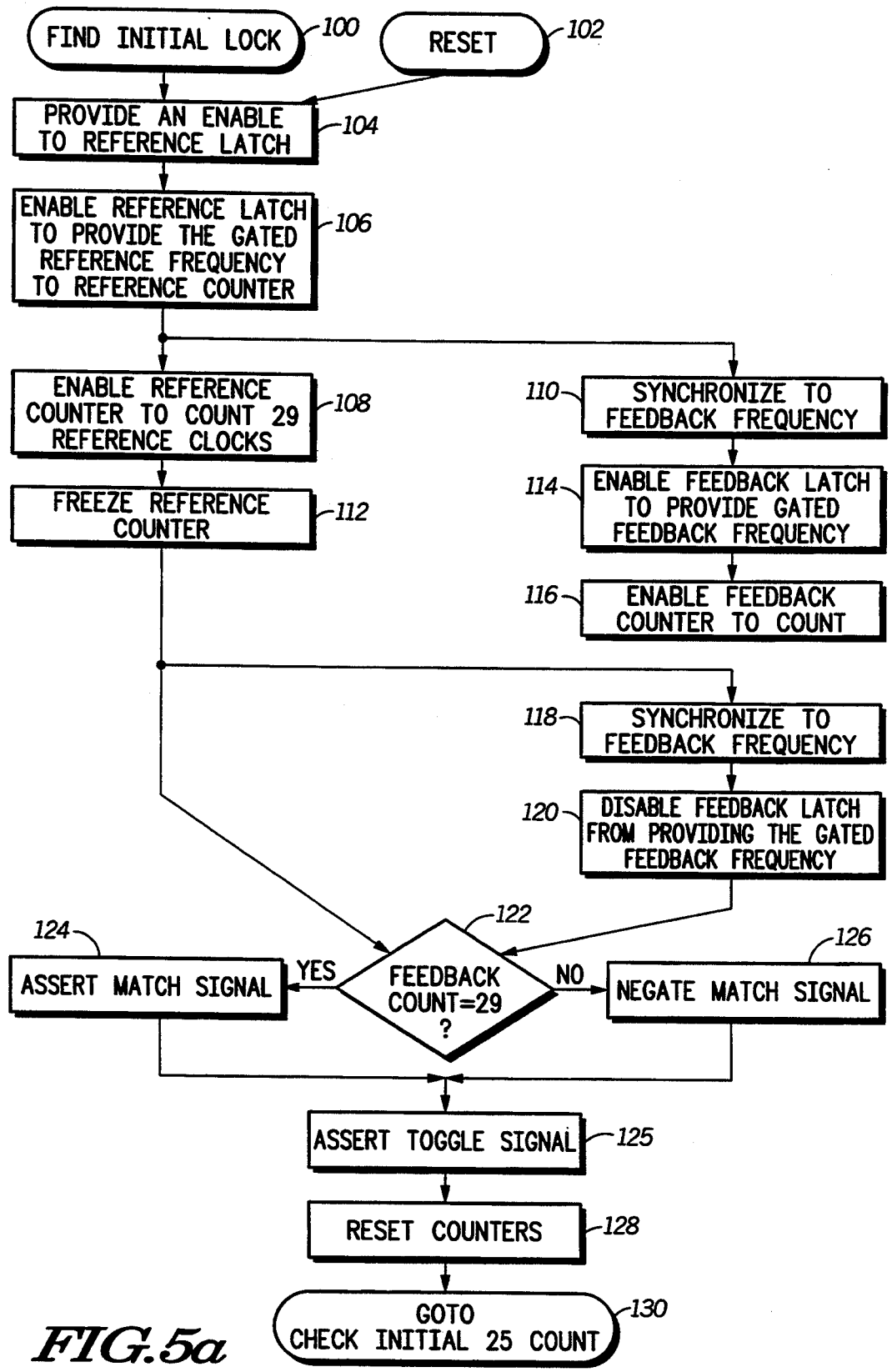
FIG. 5a illustrates in flow chart form a first portion of execution of the lock detect function in accordance with the present invention.

FIG. 5a illustrates a first portion of a flow chart of operation of phase lock loop circuit 10. Operation of phase lock loop circuit 10 is generally initiated by a reset operation (Step 102) in a data processing system or an operation in which phase lock loop circuit 10 is initiated to provide the Output Frequency signal (Step 100). Upon initiation, counter control circuit 34 provides the Reference Count Enable signal to an enabled input of reference latch 26 (Step 104). Reference latch 26 is then enabled to receive and latch the Reference Frequency signal.

Subsequently, the Gated Reference Frequency signal is provided to reference counter 32 (Step 106). Reference counter 32 counts for the first predetermined number of timing cycles of the Gated Reference Frequency signal (Step 108). In the embodiment of the invention described herein, the first predetermined number of timing cycles is equal to twenty-nine. When twenty-nine timing cycles of the Gated Reference Frequency signal have been counted, reference counter 32 asserts the Freeze signal (Step 112). The Freeze signal is then provided to counter control circuit 34.

While reference counter 32 is counting, synchronizer 28 is also enabled to synchronize the Feedback Frequency signal (Step 110). Synchronizer 28 provides the Feedback Count Enable signal to feedback latch 30 to synchronize feedback latch 30 to reference latch 26 such that the Gated Feedback Frequency signal is provided in synchrony with the Gated Reference Frequency signal (Step 114). The Feedback Count Enable signal enables feedback latch 30 to provide the Gated Feedback Frequency signal to feedback counter 36. Upon receipt of the Gated Feedback Frequency signal, feedback counter 36 begins to count (Step 116). The circuitry used to implement synchronizer 28 is well known in the data processing art and will not, therefore, be explained in further detail.

After reference counter 32 provides the Freeze signal to counter control circuit 34, synchronizer 28 is again enabled to synchronize the Reference Frequency signal to the Feedback Frequency signal (Step 118). The counter control circuit 34 negates the Reference Count Enable signal such that feedback latch 30 is not enabled to provided the Gated Feedback Frequency signal (Step 120). Therefore, feedback counter 36 no longer counts the timing cycles of the Gated Feedback Frequency signal. Feedback counter 36 counts for a same period of time as is required for reference counter 32 to count to twenty-nine and to assert the Freeze signal.

At that point in time, the Feedback Count signal provides a count value to feedback count detector 40. Feedback count detector 40 determines whether or not the count value is equal to twenty-nine, the first predetermined number used to partially determine if a lock condition is satisfied and the Locked signal should be asserted by lock detect circuit 18 (Step 122). If the count value provided by the Feedback Count signal equals twenty-nine, the CNT29 signal is asserted.

Generation of the CNT29 signal is illustrated in more detail in FIG. 3. In FIG. 3, the Feedback Count signal is provided to each of comparators 50 through 56. In the embodiment of the invention described herein, comparator 54 is used to determine when the count value provided by the Feedback Count signal is equal to twenty-nine. When the count value provided by the Feedback Count signal is equal to twenty-nine, comparator 54 asserts the CNT29 signal. The asserted CNT29 signal is provided to AND gate 62. Additionally, the CMP29 signal is asserted by anti-aliasing circuit 38 and is provided to AND gate 62. When asserted, the CMP29 signal indicates that reference counter 32 has counted to twenty-nine. A third input to AND gate 62, the Exact signal, is also asserted. The Exact signal is an inversion of the Locked signal and is asserted when the locked condition is not satisfied by phase lock loop circuit 10. Because each of its inputs is asserted, AND gate 62 provides an asserted output to OR gate 66. OR gate 66 subsequently asserts the Match signal (Step 124).

Referring again to FIG. 5a, when the count value is not equal to twenty-nine, the CNT29 signal is not asserted and, therefore, the Match signal is not asserted (Step 126).

The Toggle signal is subsequently asserted to indicate that reference counter 32 has reached a count of twenty-nine and has asserted the Freeze signal (Step 125). Anti-aliasing circuit 38 uses the Toggle signal to determine a number of timing cycles which reference counter 32 should be counting before asserting the Freeze signal. As was previously mentioned, for lock detect circuit 18 to assert the Locked signal and indicate that phase lock loop circuit 10 is frequency locked, the count value provided feedback counter 36 must be equal to the count value of reference counter 32 for two consecutive periods of time. The two periods of time are chosen such that they are not harmonically related to one another. Therefore, a lock signal is not erroneously detected when the Feedback Frequency signal is aliasing.

FIG. 4 illustrates anti-aliasing circuit 38 in more detail. The Toggle signal provides the clock input to flip-flop 68 which is used to implement anti-aliasing circuit in the embodiment of the invention described herein. The data input of flip-flop 68 is provided by an inverted data output of flip-flop 68. When the lock condition has not been met in phase lock loop circuit, the CMP29 signal output by the data output of flip-flop 68 is negated and the inverted data output of flip-flop 68 is asserted. Therefore, when the Toggle signal is asserted, the CMP29 signal is asserted and provided to feedback count detector 40 and inverter 44. Subsequently, the CMP29 input is asserted and the CMP25 input is negated.

Similarly, when the Toggle signal is asserted to indicate that reference counter 32 has counted to twenty-nine, the inverted data output of flip-flop 68 is negated. Therefore, when the Toggle signal is asserted next to indicate that reference counter 32 has counted to twenty-five, the CMP29 signal is negated and provided to inverter 44 and to the CMP29 input of feedback count detector 40. The CMP29 input is then negated and the CMP25 input is asserted.

After determining whether feedback counter 36 has counted to the same number, twenty-nine, as reference counter 32, both reference counter 32 and feedback counter 36 are reset to an initialized state (Step 128). When each of counters 32 and 36 are initialized, a next set of steps is performed to determine whether or not the lock condition has been satisfied by phase lock loop circuit 10 (Step 130).

Figure 5B:
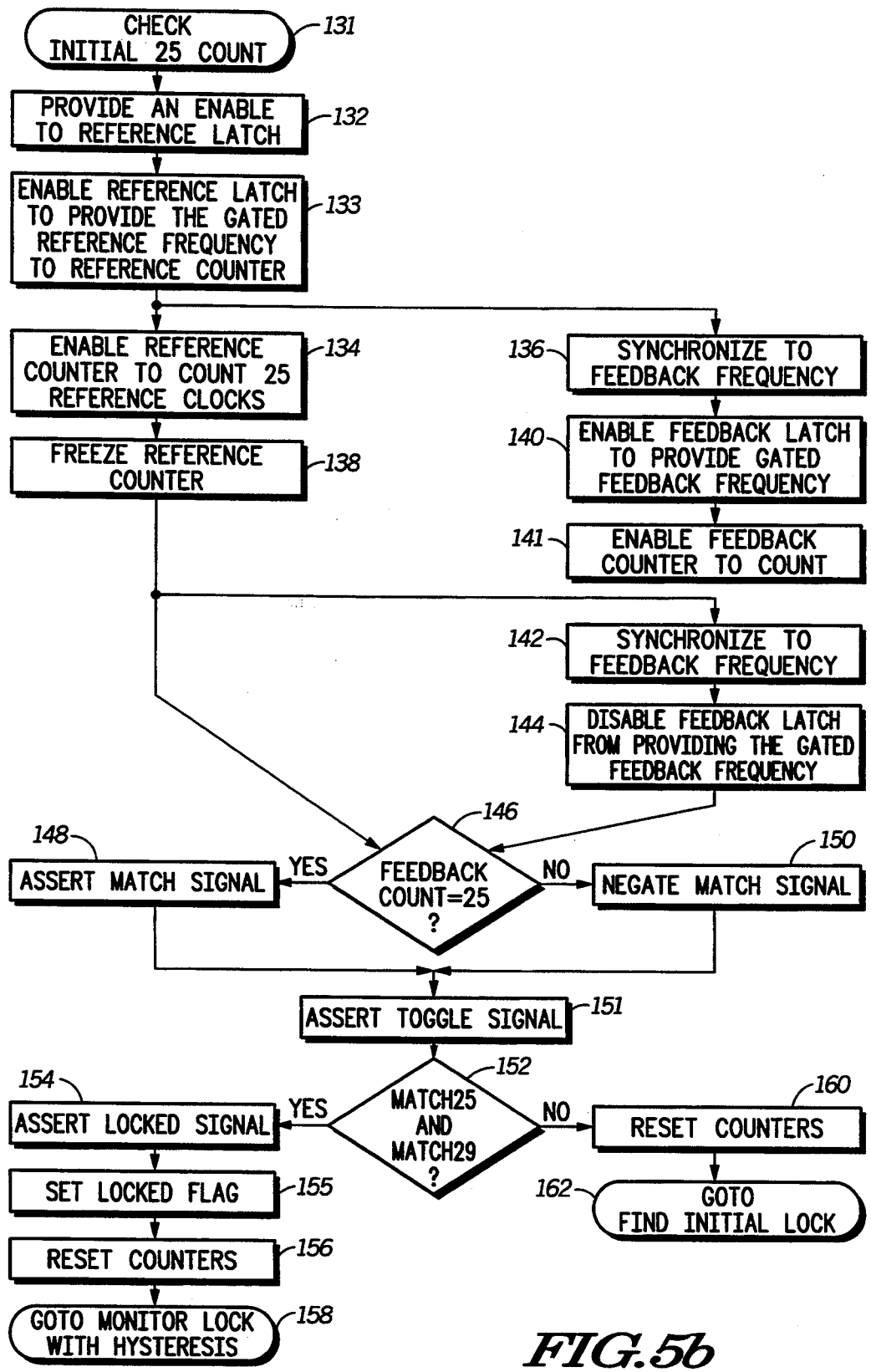
FIG. 5b illustrates in flow chart form a second portion of execution of the lock detect function in accordance with the present invention.

The next set of steps is illustrated in FIG. 5b. Step 131 initiates the next set of steps to determine if the lock condition has been achieved in phase lock loop 10. Counter control circuit 34 again provides the Reference Count Enable signal to an enabled input of reference latch 26 (Step 132). Reference latch 26 is then enabled to receive and latch the Reference Frequency signal. Subsequently, the Gated Reference Frequency signal is provided to reference counter 32 (Step 133).

The Gated Reference Frequency signal is provided to reference counter 32 and reference counter 32 counts for the second predetermined number of timing cycles of the Gated Reference Frequency signal (Step 134). In the embodiment of the invention described herein, the second predetermined number of timing cycles is equal to twenty-five. When twenty-five timing cycles of the Gated Reference Frequency signal have been counted, reference counter 32 asserts the Freeze signal (Step 138). The Freeze signal is then provided to counter control circuit 34.

While reference counter 32 is counting, synchronizer 28 is also enabled to synchronize the Feedback Frequency signal (Step 136). Synchronizer 28 provides the Feedback Count Enable signal to feedback latch 30 to synchronize feedback latch 30 to reference latch 26 such that the Gated Feedback Frequency signal is provided in synchrony with the Gated Reference Frequency signal (Step 140). The Feedback Count Enable signal enables feedback latch 30 to provide the Gated Feedback Frequency signal to feedback counter 36. Upon receipt of the Gated Feedback Frequency signal, feedback counter 36 begins to count (Step 141).

After reference counter 32 provides the Freeze signal to counter control circuit 34, synchronizer 28 is enabled to synchronize the Reference Frequency signal to the Feedback Frequency signal (Step 142). The counter control circuit 34 negates the Reference Count Enable signal such that feedback latch 30 is not enabled to provide the Gated Feedback Frequency signal (Step 144). Subsequently, feedback counter 36 no longer counts the timing cycles of the Gated Feedback Frequency signal. Therefore, feedback counter 36 counts for a same period of time as is required for reference counter 32 to count to twenty-five and to assert the Freeze signal.

At that point in time, the Feedback Count signal provides a count value to feedback count detector 40. Feedback count detector 40 determines whether or not the count value is equal to twenty-five, the second predetermined number used to determine if a lock condition is satisfied and the Locked signal should be asserted by lock detect circuit 18 (Step 146). If the count value provided by the Feedback Count signal equals twenty-five, the CNT25 signal is asserted (Step 148).

Generation of the CNT25 signal is illustrated in more detail in FIG. 3. In the embodiment of the invention described herein, comparator 50 is used to determine when the count value provided by the Feedback Count signal is equal to twenty-five. When the count value provided by the Feedback Count signal is equal to twenty-five, comparator 50 asserts the CNT25 signal. The asserted CNT25 signal is provided to AND gate 58. Additionally, the CMP25 signal is asserted and is provided to AND gate 58. A third input to AND gate 58, the Exact signal, is also asserted. As was previously described, the Exact signal is the inversion of the Locked signal and is asserted when the locked condition is not satisfied by phase lock loop circuit 10. Because each of its inputs is asserted, AND gate 58 provides an asserted output to OR gate 66. OR gate 66 subsequently asserts the Match signal (Step 148).

Referring again to FIG. 5b, when the CNT25 signal is asserted, the Match signal is also asserted. However, when the count value is not equal to twenty-five, the Match signal is negated (Step 150). After the Match signal has been asserted or negated, counter control circuit 34 pulses the Toggle signal to indicate that reference counter 32 has reached a count of twenty-five and has asserted the Freeze signal (Step 151). When the Toggle signal is asserted next to indicate that reference counter 32 has counted to twenty-five, anti-aliasing circuit 38 negates the CMP29 signal to indicate that reference counter 32 has counted to twenty-five. The CMP29 signal is negated and provided to inverter 44 and to the CMP29 input of feedback count detector 40. The CMP29 input is then negated and the CMP25 input is asserted.

Assuming that the Match signal is asserted to indicate that the count value provided by the Feedback Count signal is equal to twenty-five, match detector 48 detects the asserted Match signal. As was previously mentioned, match detector 48 requires that the Match signal be asserted for two consecutive periods of time. In the embodiment of the invention described herein, the count value provided by the Feedback Count signal must be equal to the count value of reference counter 32. The count value of reference counter 32 is equal to twenty-nine for the first period of time and to twenty-five for the second period of time.

Match detector 48 determines whether or not this condition has been met before asserting the Locked signal to indicate that phase lock loop circuit 10 has met the lock criteria (Step 152). Match detector 48 determines whether or not the Match signal was asserted to indicate that the count value provided by the Feedback Count signal was equal to twenty-nine during a first period of time and was equal to twenty-five during a second consecutive period of time.

If the Match signal is asserted during both periods of time, match detector 48 asserts the Locked signal to indicate that phase lock loop circuit 10 has achieved the lock condition (Step 154). The Locked signal is provided to status register 22 to set the locked bit stored therein (Step 155). Subsequently, each of counters 32 and 36 is reset to an initial value (Step 156) and phase lock loop 10 is monitored to indicate when phase lock loop circuit 10 is no longer in the locked state (Step 158).

If the Match signal is not asserted during either one of the first and second periods of time, match detector 48 does not assert the Locked signal. Both reference counter 32 and feedback counter 36 are subsequently reset to an initialized state (Step 160). After each of counters 32 and 36 are initialized, a lock detect circuit 18 again begins to try to determine when an initial lock condition has been satisfied (Step 162). Lock detect circuit 18 performs the previously described set of steps until lock is achieved and the Locked signal is asserted.

Figure 5C:
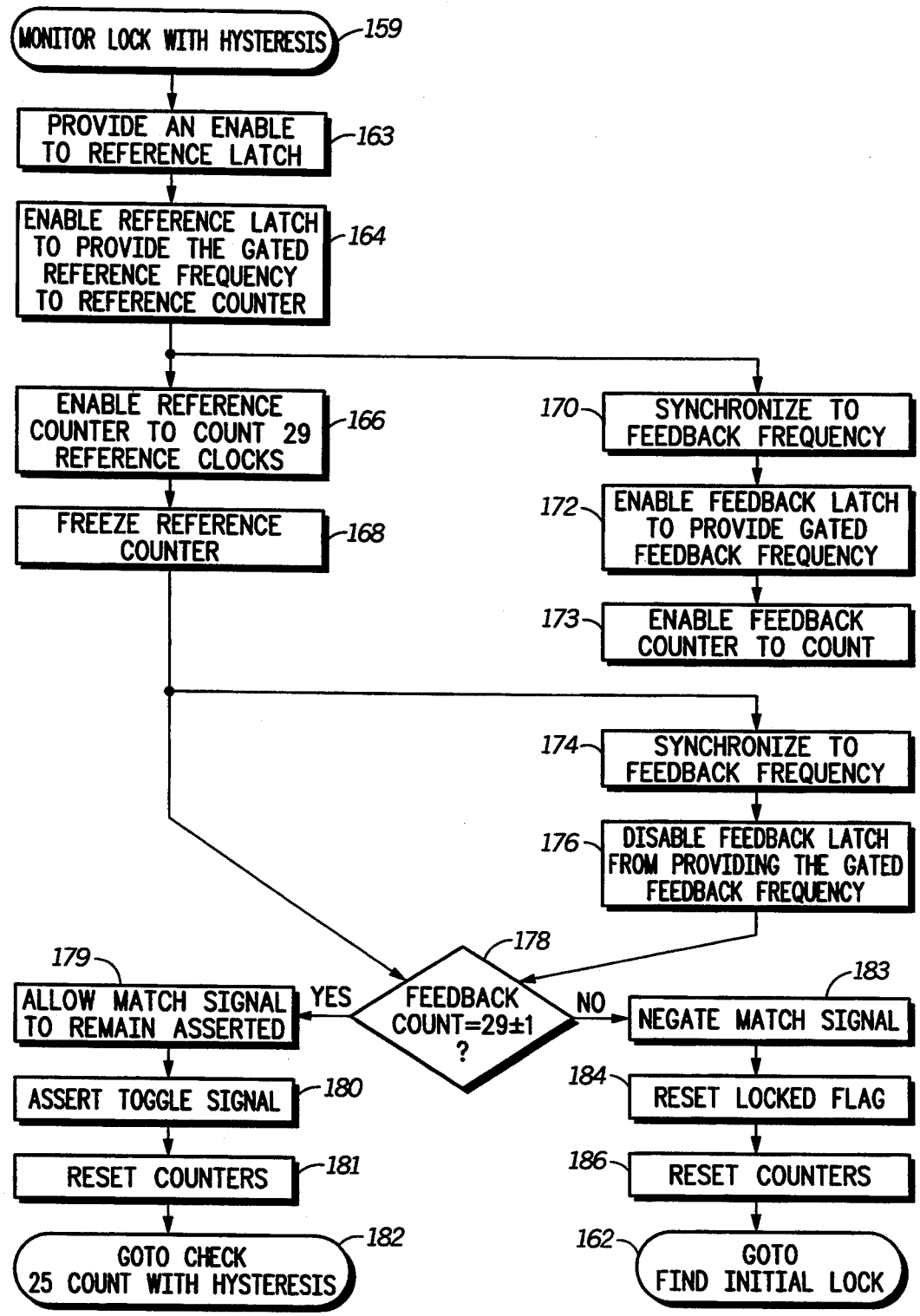
FIG. 5c illustrates in flow chart form a third portion of execution of the lock detect function in accordance with the present invention.

FIG. 5c illustrates a set of steps which are performed after the Locked signal is first asserted. In the steps illustrated in FIG. 5c, phase lock loop 10 is monitored to indicate when phase lock loop circuit 10 is no longer in the locked state (Step 158).

As was previously described, when the Feedback Frequency signal is within approximately 1.6% to 3.3% of the frequency of the Reference Frequency signal, phase lock loop circuit 10 is considered to be in a locked state. In this small range, lock detect circuit 18 may indicate that phase lock loop circuit 10 is toggling in and out of lock. Frequency hysteresis is used to stabilize this characteristic by opening up the count window such that the Feedback Frequency signal may be within an approximate lock range of −3.3% to +3.3% of the frequency of the Reference Frequency signal and still satisfy the lock condition. When the Feedback Frequency signal drifts completely out of the lock range (±3.3%), lock detect circuit 18 will negate the Locked signal and phase lock loop circuit 10 will be considered to be "unlocked".

In order to perform the function described above, feedback count detector 40 does not require the count value provided by the Feedback Count signal to be equal to the count value of reference counter 32 after lock detect circuit 18 initially determines that the lock condition has been achieved. Once the lock condition has been achieved and the Locked signal is initially asserted, lock detect circuit 18 allows the count value provided by the Feedback Count signal to be within ±1 of the count value of reference counter 32. By allowing a broader range of frequencies, lock detect circuit 18 will not erroneously detect that phase lock loop circuit 10 is in lock or out of lock when the frequency of the Feedback Frequency signal oscillates slightly around the frequency of the Reference Frequency signal.

FIG. 5c illustrates a third portion of the flow chart of operation of phase lock loop circuit 10 in which the lock of phase lock loop circuit 10 is monitored after the Locked signal is initially asserted. (Step 159) When the Locked signal is asserted, counter control circuit 34 provides the Reference Count Enable signal to an enabled input of reference latch 26 (Step 163). Reference latch 26 is then enabled to receive and latch the Reference Frequency signal. Subsequently, the Gated Reference Frequency signal is provided to reference counter 32 (Step 164).

The Gated Reference Frequency signal is provided to reference counter 32. Reference counter 32 counts for twenty-nine timing cycles of the Gated Reference Frequency signal (Step 166). When twenty-nine timing cycles of the Gated Reference Frequency signal have been counter, reference counter 32 asserts the Freeze signal (Step 168). The Freeze signal is then provided to counter control circuit 34.

While reference counter 32 is counting, synchronizer 28 is also enabled to synchronize the Feedback Frequency signal (Step 170). Synchronizer 28 provides the Feedback Count Enable signal to feedback latch 30 to synchronize feedback latch 30 to reference latch 26 such that the Gated Feedback Frequency signal is provided in synchrony with the Gated Reference Frequency signal (Step 172). The Feedback Count Enable signal enables feedback latch 30 to provide the Gated Feedback Frequency signal to feedback counter 36. Upon receipt of the Gated Feedback Frequency signal, feedback counter 36 begins to count (Step 173).

After reference counter 32 provides the Freeze signal to counter control circuit 34, synchronizer 28 is enabled to synchronize the Reference Frequency signal to the Feedback Frequency signal (Step 174). The counter control circuit 34 negates the Reference Count Enable signal such that feedback latch 30 is not enabled to provided the Gated Feedback Frequency signal (Step 176). Subsequently, feedback counter 36 no longer counts the timing cycles of the Gated Feedback Frequency signal. Therefore, feedback counter 36 counts for a same period of time as is required for reference counter 32 to count to twenty-nine and to assert the Freeze signal.

At that point in time, the Feedback Count signal provides the count value to feedback count detector 40. Feedback count detector 40 determines whether or not the count value is equal to either twenty-eight, twenty-nine, or thirty. Theses numbers were chosen to be equal to 29±1 such that frequency hysteresis will not result in lock detect circuit erroneously indicating that phase lock loop circuit 10 is not in a locked state (Step 178). Remember that twenty-nine is the first predetermined number used to partially determine if a lock condition is satisfied and the Locked signal should be asserted by lock detect circuit 18. If the count value provided by the Feedback Count signal equals either twenty-eight, twenty-nine, or thirty, the CNT29X signal is generated.

Generation of the CNT29X signal is illustrated in more detail in FIG. 3. In FIG. 3, the Feedback Count signal is provided to each of comparators 50 through 56. In the embodiment of the invention described herein, comparator 56 is used to determine when the count value provided by the Feedback Count signal is equal to either twenty-eight, twenty-nine, or thirty. When the count value provided by the Feedback Count signal is equal to one of the values listed above, comparator 56 asserts the CNT29X signal. The asserted CNT29X signal is provided to AND gate 64. Additionally, the CMP29 signal is asserted and is provided to AND gate 64 to indicate that reference counter 32 is counting to twenty-nine, rather than twenty-five. A third input to AND gate 64, the Locked signal, is also asserted. The Locked signal is asserted because phase lock loop circuit 10 is in the locked state. Because each of its inputs is asserted, AND gate 64 provides an asserted output to OR gate 66. OR gate 66 subsequently allows the Match signal to remain asserted (Step 179).

Referring again to FIG. 5c, when the CNT29X signal is asserted, counter control circuit 34 asserts the Toggle signal to indicate that reference counter 32 has reached a count of twenty-nine and has asserted the Freeze signal (Step 180). Each of counters 32 and 36 are then reset to an initialized state (Step 181) and lock detect circuit 10 continues to monitor the locked state of phase locked loop circuit 10 (Step 182).

When the count value is not equal to either twenty-eight, twenty-nine, or thirty, the CNT29X signal is not asserted and, therefore, the Match signal is negated (Step 183). When the Match signal is negated, match detector 48 negates the Locked signal to indicate that phase lock loop circuit 10 is no longer in the locked state. Subsequently, the Locked signal is provided to status register 22 to negate a Locked flag stored therein (Step 184).

Both reference counter 32 and feedback counter 36 are then reset to an initialized state (Step 186). After each of counters 32 and 36 are initialized, lock detect circuit 18 again begins to try to determine when an initial lock condition has been satisfied (Step 162). Lock detect circuit 18 performs the set of steps illustrated in FIG. 5a and FIG. 5b until lock is achieved and the Locked signal is asserted.

Figure 5D:
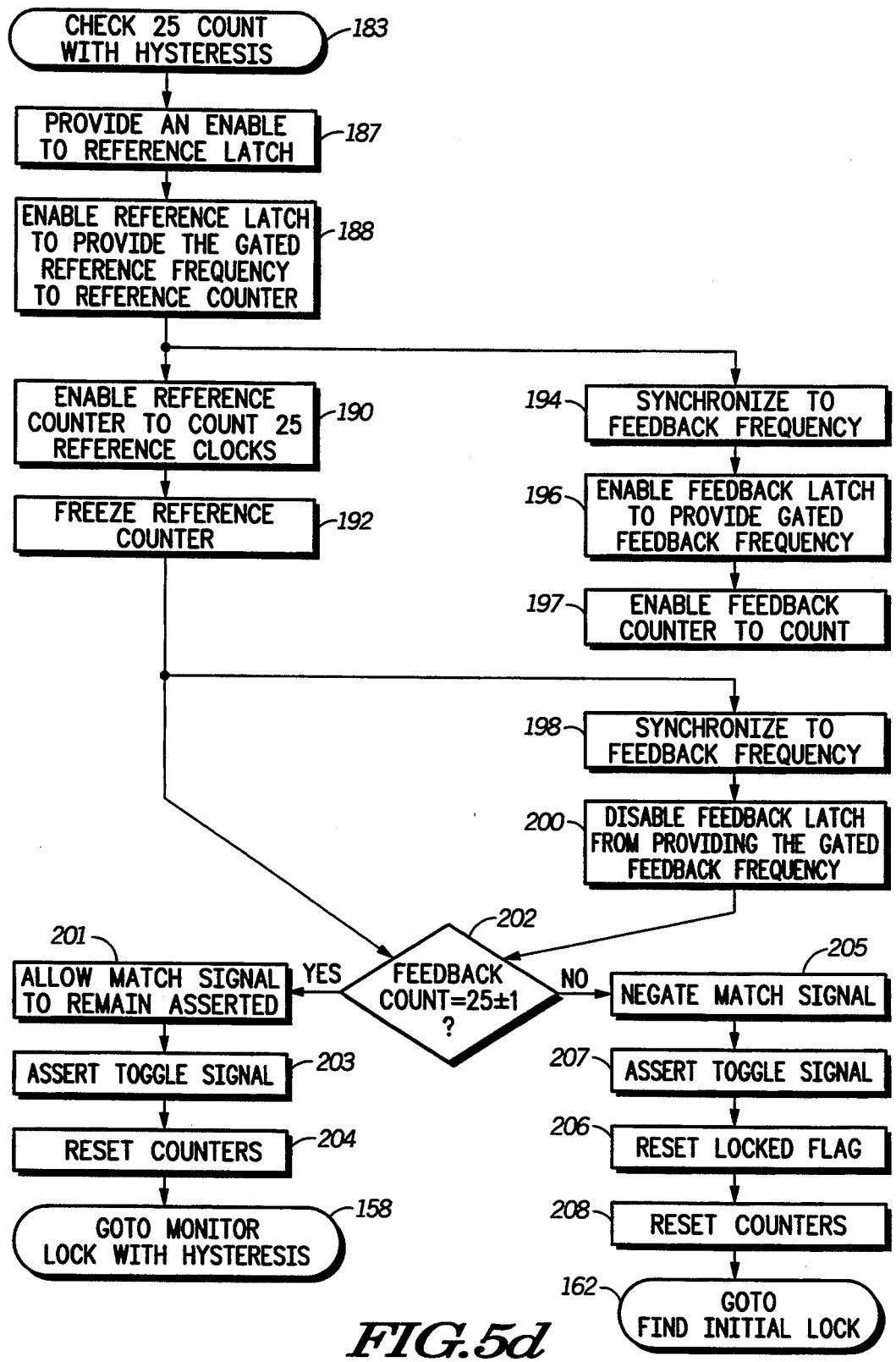
FIG. 5d illustrates in flow chart form a fourth portion of execution of the lock detect function in accordance with the present invention.

FIG. 5d illustrates a next portion of the flow chart of operation in which the lock of phase lock loop circuit 10 continues to be monitored after the Locked signal is initially asserted. (Step 183) When the Locked signal is asserted, counter control circuit 34 provides the Reference Count Enable signal to an enabled input of reference latch 26 (Step 187). Reference latch 26 is then enabled to receive and latch the Reference Frequency signal. Subsequently, the Gated Reference Frequency signal is provided to reference counter 32 (Step 188).

The Gated Reference Frequency signal is provided to reference counter 32. Reference counter 32 counts for twenty-five timing cycles of the Gated Reference Frequency signal (Step 190). When twenty-five timing cycles of the Gated Reference Frequency signal have been counted, reference counter 32 asserts the Freeze signal (Step 192). The Freeze signal is then provided to counter control circuit 34.

While reference counter 32 is counting, synchronizer 28 is also enabled to synchronize the Feedback Frequency signal (Step 194). Synchronizer 28 provides the Feedback Count Enable signal to feedback latch 30 to synchronize feedback latch 30 to reference latch 26 such that the Gated Feedback Frequency signal is provided in synchrony with the Gated Reference Frequency signal (Step 196). The Feedback Count Enable signal enables feedback latch 30 to provide the Gated Feedback Frequency signal to feedback counter 36. Upon receipt of the Gated Feedback Frequency signal, feedback counter 36 begins to count (Step 197).

After reference counter 32 provides the Freeze signal to counter control circuit 34, synchronizer 28 is enabled to synchronize the Reference Frequency signal to the Feedback Frequency signal (Step 198). The counter control circuit 34 negates the Reference Count Enable signal such that feedback latch 30 is not enabled to provided the Gated Feedback Frequency signal (Step 200). Subsequently, feedback counter 36 no longer count the timing cycles of the Gated Feedback Frequency signal. Therefore, feedback counter 36 counts for a same period of time as is required for reference counter 32 to count to twenty-five and to assert the Freeze signal.

At that point in time, the Feedback Count signal provides the count value to feedback count detector 40. Feedback count detector 40 determines whether or not the count value is equal to either twenty-four, twenty-five, or twenty-six. Theses numbers were chosen to be equal to 25±1 such that frequency hysteresis will not result in lock detect circuit erroneously indicating that phase lock loop circuit 10 is not in a locked state (Step 202). Remember that twenty-five is the second number used to partially determine if a lock condition is satisfied and the Locked signal should be asserted by lock detect circuit 18. If the count value provided by the Feedback Count signal equals either twenty-four, twenty-five, or twenty-six, the CNT25X signal is generated.

Generation of the CNT25X signal is illustrated in more detail in FIG. 3. In the embodiment of the invention described herein, comparator 52 is used to determine when the count value provided by the Feedback Count signal is equal to either twenty-four, twenty-five, or twenty-six. When the count value provided by the Feedback Count signal is equal to one of the values listed above, comparator 52 asserts the CNT25X signal. The asserted CNT25X signal is provided to AND gate 60. Additionally, the CMP25 signal is asserted and is provided to AND gate 60 to indicate that reference counter 32 is counting to twenty-five, rather than twenty-nine. A third input to AND gate 64, the Locked signal, is also asserted. The Locked signal is asserted because phase lock loop circuit 10 is in the locked state. Because each of its inputs is asserted, AND gate 60 provides an asserted output to OR gate 66. OR gate 66 subsequently allows the Match signal to remain asserted (Step 201).

Referring again to FIG. 5d, when the CNT25X signal is asserted, counter control circuit 34 asserts the Toggle signal to indicate that reference counter 32 has reached a count of twenty-five and has asserted the Freeze signal (Step 203). Each of counters 32 and 36 are then reset to an initialized state (Step 204) and lock detect circuit 10 continues to monitor the locked state of phase locked loop circuit 10 (Step 158).

When the count value is not equal to either twenty-four, twenty-five, or twenty-six, the CNT25X signal is not asserted and, therefore, the Match signal is negated (Step 205). As well, counter control circuit 34 pulses the Toggle signal to indicate that reference counter 32 has reached a count of twenty-five and has asserted the Freeze signal (Step 207). When the Match signal is negated, match detector 48 negates the Locked signal to indicate that phase lock loop circuit 10 is no longer in the locked state. Subsequently, the Locked signal is provided to status register 22 to negate a Locked flag stored therein (Step 206).

Both reference counter 32 and feedback counter 36 are then reset to an initialized state (Step 208). After each of counters 32 and 36 are initialized, lock detect circuit 18 again begins to try to determine when an initial lock condition has been satisfied (Step 162). Lock detect circuit 18 performs the set of steps illustrated in FIG. 5a and FIG. 5b until lock is achieved and the Locked signal is asserted.

In addition to detecting when phase lock loop circuit 10 is in the locked state, lock detect circuit 18 also uses a relationship between the Reference Frequency signal and the Feedback Frequency signal to control operating parameters of phase lock loop circuit 10. For example, feedback count detector 40 is used to determine when charge pump 14 should be quickly ramped on to quickly increase the voltage of the Voltage signal and when charge pump 14 should be used more moderately to modify the voltage of the Voltage signal at a slower pace. Such operations are used to enable phase lock loop circuit 10 to satisfy the lock condition more quickly when phase lock loop circuit 10 is first powered up.

When phase lock loop circuit 10 is first powered up, feedback count detector 40 negates the Kickoff Control signal. The Kickoff Control signal remains negated until the count value provided by the Feedback Count signal is equal to a kickoff count value which is determined by a user of phase lock loop circuit 10. In the embodiment of the invention described herein, the kickoff count value is equal to sixteen such that charge pump 14 quickly increases the Voltage signal until the resulting Feedback Frequency is within approximately fifty percent of the frequency of the Reference Frequency signal.

When the count value provided by the Feedback Count signal is equal to the kickoff count value, comparator 70 asserts the Kickoff Control signal. The Kickoff Control signal is provided to auxiliary control generator 46 to produce the Kickoff signal. The Kickoff signal is provided to charge pump 14 to decrease the rate at which charge pump 14 is increasing the voltage of the Voltage signal. Subsequently, the rate at which the frequency of the Feedback Frequency signal is changing is also decreased.

By generating the Kickoff Control signal and providing auxiliary control generator 56, lock detect circuit 18 is able to control operation of charge pump 14 such that phase lock loop 10 achieves the lock condition more efficiently. The frequency of the Feedback Frequency signal may be controlled such that it does not "overshoot" the frequency of the Reference Frequency signal. Therefore, fewer iterations of raising and lowering the frequency of the Feedback Frequency signal are required for phase lock loop circuit 10 to achieve the locked state.

Lock detect circuit 18 provides a unique circuit and method for detecting lock in a phase locked loop system. Two counters are used to count the timing cycles of a reference frequency and a feedback frequency over two periods of time to determine if the phase locked loop system is in the locked state. The two counters must be equal for both periods of time before lock detect circuit 18 will indicate that phase lock loop circuit 18 has satisfied the lock condition. Because the two periods of time used during this measurement are not harmonically related, aliasing between the feedback frequency and the reference frequency will be detected and lock detect circuit 18 will not indicate that the phase locked loop system is in the lock condition. In some cases, aliasing of the feedback frequency may result in an erroneous lock detection if only one period of time were used. However, by using two periods of time which are not harmonically related, the lock condition will only be detected when the feedback frequency is actually locked to the reference frequency.

Additionally, once lock has been detected, lock detect circuit 18 widens a lock range used to detect lock so that frequency hysteresis will not result in the detection of an unlocked condition. The feedback frequency must then drift completely outside the lock range for the phase locked loop system to be unlocked.

Lock detect circuit 18 performs each of these functions using only digital logic. No analog devices are used. In prior art devices, an analog integrator was required to detect the locked condition. The integrator typically required near-exact phase match as well as precise values of analog components to detect the locked condition. Such precise values are typically difficult to obtain on an integrated circuit. However, the digital logic used to implement lock detect circuit 18 is easily reproduced and is not sensitive to minor variations in the processing parameters used to form the integrated circuits. Therefore, the accuracy of lock detect circuit 18 may be more closely controlled and more reliable results will be generated. Additionally, analog circuitry is typically susceptible to noise in a digital system which may decrease the reliability of the phase lock loop system. Because lock detect circuit 18 has no analog circuitry, lock detect circuit 18 is less likely than traditional analog circuitry to erroneously indicate that the phase locked loop system is either locked or unlocked.

As has been explained herein, lock detect circuit 18 uses frequency based match detection to detect lock in the phase locked loop system. Prior art systems have generally used phase matching to detect lock. Phase matching is very sensitive to phase jitter which is inherent in most voltage controlled oscillators. Because lock detect circuit 18 uses frequency matching, the phase jitter inherent in voltage controlled oscillators is inconsequential.

Each of the advantages described above is implemented using a small amount of additional digital logic. Therefore, lock detect circuit 18 provides a more efficient circuit for determining lock in the phase locked loop system.

The implementation of the invention described herein is provided by way of example only. However, many other implementations may exist for executing the function described herein. For example, each of counters 32 and 36 may have a bit width which is greater than or less than five. A bit width of five was chosen in this embodiment of the invention because it provides an appropriate balance between accuracy and rate of lock detection. More bit width provides greater accuracy during a lock detection operation and less bit width provide a faster rate of lock detection. Additionally, it should be understood that an order in which the count values are performed may be changed. The order of the count values provided herein is provided for example only. For example, the lock detect circuit disclosed herein may detect a count of twenty-five before detecting a count of twenty-nine. Additionally, the count values may be any two numbers which are not harmonically related. The count values should not be restricted to the values disclosed herein.

While there have been described herein the principles of the invention, it is to be clearly understood to those skilled in the art that this description is made only by way of example and not as a limitation to the scope of the invention. Accordingly, it is intended, by the appended claims to cover all modifications of the invention which fall within the true spirit and scope of the invention.

We claim:

1. A lock detect circuit, comprising:
   first input means for receiving a reference frequency;
   second input means for receiving a feedback frequency;
   a reference counter coupled to the first input means for receiving the reference frequency, the reference counter counting to a reference count value during a first period of time, the reference counter providing a freeze signal to indicate the reference counter has reached the reference count value;
   a feedback counter coupled to the second input means for receiving the feedback frequency, the feedback counter counting for the first period of time to generate a feedback count value;
   comparison means for comparing the feedback count value to the reference count value, the comparison means asserting a first match signal when the feedback count value is one of a range of lock values determined by the reference count value and a locked signal is asserted to indicate the first match signal is asserted for a second and a third period of time, the third period of time successively following the second period of time, the comparison means being coupled to the feedback counter for receiving the feedback count value; and
   a match detector coupled to the comparison means for providing the locked signal, the match detector asserting the locked signal when the comparison means asserts the first match signal for both the second period of time and the third period of time.

2. The lock detect circuit of claim 1 further comprising:
   a counter control circuit coupled to the reference counter for receiving the freeze signal, the counter control circuit providing a toggle signal to indicate the reference count value is one of a first count value and a second count value, wherein the first count value is not harmonically related to the second count value.

3. The lock detect circuit of claim 2 wherein the first match signal is asserted during the second period of time when the feedback count value is equal to the first count value.

4. The lock detect circuit of claim 2 wherein a second match signal is asserted during the third period of time when the feedback count value is equal to the second count value.

5. The lock detect circuit of claim 1 wherein each of the range of lock values is equal to a preselected percentage of the reference count value.

6. The lock detect circuit of claim 1 further comprising:
   an auxiliary control generator for generating a kickoff signal in response to the locked signal, the kickoff signal being used to operate a charge pump external to the lock detect circuit, the auxiliary control generator being coupled to the match detector for receiving the locked signal.

7. The lock detect circuit of claim 6 wherein the comparison means comprises:
   a first comparator for comparing the feedback count value to an auxiliary count value, the first comparator asserting a kickoff control signal to indicate that the feedback count value is equal to the auxiliary count value, the first comparator negating the kickoff control signal to indicate that the feedback count value is not equal to the auxiliary count value.

8. The lock detect circuit of claim 1 wherein the reference frequency is provided by a crystal oscillator external to the lock detect circuit.

9. The lock detect circuit of claim 1 wherein the feedback frequency is provided by a voltage controlled oscillator external to the lock detect circuit.

10. A method for detecting lock in a phase lock loop circuit, comprising the steps of:
    i) receiving a reference frequency signal;
    ii) receiving a feedback frequency signal;
    iii) enabling a reference counter to count for a first period of time using the reference frequency signal, the reference counter providing a first reference count value;
    iv) concurrently enabling a feedback counter to count for the first period of time using the feedback frequency signal, the feedback counter providing a first feedback count value;
    v) comparing the first reference count value and the first feedback count value to provide a first match signal;
    vi) providing the first match signal to a match detect circuit, the match detect circuit storing the first match signal therein;
    vii) enabling the reference counter to count for a second period of time using the reference frequency signal, the reference counter providing a second reference count value;
    viii) concurrently enabling the feedback counter to count for the second period of time using the feedback frequency signal, the feedback counter providing a second feedback count value;

ix) comparing the second reference count value and the second feedback count value to provide a second match signal, the second match signal being asserted when the second feedback count value is equal to the second reference count value and the locked signal is not asserted; and x) providing the second match signal to the match detect circuit, the match detect circuit asserting the locked signal when both the first match signal and the second match signal are asserted.

11. The method of claim 10 further comprising the steps of:

xi) enabling the reference counter to count for the first period of time using the reference frequency signal, the reference counter providing the first reference count value;

xii) concurrently enabling the feedback counter to count for the first period of time using the feedback frequency signal, the feedback counter providing a third feedback count value;

xiii) comparing the first reference count value and the third feedback count value to provide a third match signal, the third match signal being asserted when the third feedback count value is one of a first count value range and the locked signal is asserted to indicate the third match signal is asserted for a second and a third period of time, the third period of time successively following the second period of time, the third match signal being negated when the third feedback count value is not one of the first count value range;

xiv) if the third match signal is not asserted, repeating each of steps i) through x);

xv) if the third match signal is asserted, providing the third match signal to the match detect circuit, the match detect circuit storing the third match signal therein;

xvi) enabling the reference counter to count for the second period of time using the reference frequency signal, the reference counter providing the second reference count value;

xvii) concurrently enabling the feedback counter to count for the second period of time using the feedback frequency signal, the feedback counter providing a fourth feedback count value;

xviii) comparing the second reference count value and the fourth feedback count value to provide a fourth match signal, the fourth match signal being asserted when the fourth feedback count value is one of a second count value range and the locked signal is asserted; and xix) if the fourth match signal is negated, repeating each of steps i) through x); and xx) if the fourth match signal is asserted, providing the fourth match signal to the match detect circuit, the match detect circuit allowing the locked signal to remain asserted when both the third match signal and the fourth match signal are asserted.

12. The method of claim 11 wherein the first count value range comprises a first plurality of count values wherein each of the first plurality of count values corresponds to a preselected percentage of the first reference count value.

13. The method of claim 11 wherein the second count value range comprises a second plurality of count values wherein each of the second plurality of count values corresponds to a preselected percentage of the second reference count value.

14. The method of claim 10 wherein the first period of time and the second period of time are not harmonically related.

15. A phase lock loop system, comprising:

first interface means for receiving a reference frequency signal;

second interface means for receiving a feedback frequency signal;

a phase comparator for comparing a phase of the reference frequency signal to a phase of the feedback frequency signal, the phase comparator providing a frequency control signal in response to a difference between the phase of the reference frequency signal and the phase of the feedback frequency signal, the phase comparator having a first input coupled to the first interface means for receiving the reference frequency signal, the phase comparator having a second input coupled to the second interface means for receiving the feedback frequency signal;

a charge pump coupled to the phase comparator for receiving the frequency control signal, the charge pump providing a voltage value in response to the frequency control signal;

a voltage controlled oscillator coupled to the charge pump for receiving the voltage value, the voltage controlled oscillator providing the feedback frequency signal, the feedback frequency signal being determined in response to the voltage value; and a lock detect circuit for detecting when the feedback frequency signal is locked to the reference frequency signal, the lock detect circuit asserting a locked signal to indicate when the feedback frequency signal is locked to the reference frequency signal, wherein the lock detect circuit comprises:

a reference counter coupled to the first interface means for receiving the reference frequency signal, the reference counter counting to a reference count value during a first period of time, the reference counter providing a freeze signal to indicate the reference counter has reached the reference count value;

a feedback counter coupled to the second interface means for receiving the feedback frequency signal, the feedback counter counting for the first period of time to generate a feedback count value;

comparison means for comparing the feedback count value to the reference count value, the comparison means asserting asserting a match signal when the feedback count value is one of a range of lock values and a locked signal is asserted to indicate the match signal is asserted for a second and a third period of time, the third period of time successively following the second period of time, the comparison means being coupled to the feedback counter for receiving the feedback count value;

a match detector coupled to the comparison means for providing the locked signal, the match detector asserting the locked signal when the comparison means asserts a first and a second match signal, the first and the second match signals being successively asserted; and an auxiliary control generator for generating an auxiliary control signal for enhancing operation of the charge pump, the auxiliary control signal being asserted when the feedback count value is equal to an auxiliary count value.

16. The phase lock loop system of claim 15 wherein the auxiliary count value is a preselected percentage of the reference count value.

17. The phase lock loop system of claim 15 wherein the asserted auxiliary control signal enables the charge pump to output an enhanced voltage value, the enhanced voltage value having a higher value than the voltage value provided by the charge pump when the auxiliary control signal is negated.

18. The phase lock loop system of claim 15 further comprising:

a status register for storing a lock status bit, the lock status bit corresponding to a logic state of the locked signal, the status register being coupled to the lock detect circuit for receiving the locked signal.

19. The phase lock loop system of claim 15 further comprising:

a counter control circuit coupled to the reference counter for receiving the freeze signal, the counter control circuit providing a toggle signal to indicate the reference count value is one of a first count value and a second count value, wherein the first count value is not harmonically related to the second count value.

* * * * *